United States Patent [19]

Thackeray et al.

[11] Patent Number: 5,514,520
[45] Date of Patent: May 7, 1996

[54] RADIATION SENSITIVE COMPOSITION COMPRISING POLYMER HAVING INERT BLOCKING GROUPS

[75] Inventors: James W. Thackeray, Braintree; George W. Orsula, Tewksbury; Mark D. Denison, Cambridge; Roger Sinta, Woburn; Sheri L. Ablaza, Brookline, all of Mass.

[73] Assignee: Shipley Company, L.L.C., Marlborough, Mass.

[21] Appl. No.: 405,800

[22] Filed: Mar. 16, 1995

[51] Int. Cl.⁶ .................................................... G03F 7/038
[52] U.S. Cl. .................... 430/270.14; 430/192; 430/905; 522/126
[58] Field of Search ............................ 522/126; 430/905, 430/192, 270

[56] References Cited

U.S. PATENT DOCUMENTS

| | | | |
|---|---|---|---|
| 4,564,575 | 1/1986 | Perreault et al. | 430/192 X |
| 5,128,232 | 7/1992 | Thackeray et al. | 430/905 X |
| 5,204,218 | 4/1993 | Kumada et al. | 430/270 |
| 5,362,600 | 11/1994 | Sinta et al. | 430/192 |

FOREIGN PATENT DOCUMENTS

| | | | |
|---|---|---|---|
| 60-230136 | 11/1985 | Japan | 430/270 |
| 4-136859 | 5/1992 | Japan | 430/270 |
| 5-127376 | 5/1993 | Japan | 430/270 |

*Primary Examiner*—Cynthia Hamilton
*Attorney, Agent, or Firm*—Robert L. Goldberg

[57] ABSTRACT

A photoresist composition consisting of an acid or base generator, a crosslinking agent activated in the presence of an acid or base and an alkali soluble resin, preferably a phenolic resin, having a portion of its phenolic hydroxyl groups reacted to form a blocking group inert to acid or base. The presence of the inert blocking group enables development of an exposed photoresist with a strong developer without formation of microbridges between fine line features.

19 Claims, No Drawings

RADIATION SENSITIVE COMPOSITION COMPRISING POLYMER HAVING INERT BLOCKING GROUPS

BACKGROUND OF THE INVENTION

1. Field of the Invention

This invention relates to novel polymers and the use of the novel polymers for the formulation of photoresists particularly suitable for deep U.V. exposure having the capability of forming highly resolved features of submicron dimension.

2. Description of the Prior Art

Photoresists are photosensitive films used for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque to activating radiation and other areas transparent to activating radiation. The pattern in the photomask of opaque and transparent areas defines a desired image that may be used to transfer the image to a substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principles, Practices and Materials, Plenum Press, New York (1988).

Known photoresists can provide features having resolution and size sufficient for many existing commercial applications. However for many other applications, the need exists for new photoresists that can provide highly resolved images of submicron dimension.

Highly useful photoresist compositions are disclosed in U.S. Pat. No. 5,128,232 to Thackeray et al. The patent discloses, inter alia, the use of a resist resin binder that comprises a copolymer of non-aromatic cyclic alcohol units and phenol units. The disclosed photoresists are particularly suitable for exposure to deep U.V. (DUV) radiation. As is recognized by those in the art, DUV radiation refers to exposure of the photoresist to radiation having a wavelength in the range of about 350 nm or less, more typically in the range of about 300 nm or less.

A class of photoresists for which the copolymers of the non-aromatic cyclic alcohol and phenol units are particularly suitable are the compositions that comprise a resin binder, a photoacid or photobase generator and one or more other materials that will result in curing, cross-linking or hardening of the composition upon exposure to activating radiation and heating as necessary to complete the cure. A preferred composition is an acid-hardening photoresist that comprises a photoacid generator, a resin binder comprising the non-aromatic cyclic alcohol and phenol units, and an amine-based cross-linker such as a melamine-formaldehyde resin exemplified by the Cymel resins available from American Cyanamid. These acid-hardening resists are described in numerous publications including European Patent Applications Nos. 0 164 248 and 0 232 972 and in U.S. Pat. No. 5,128,232, each incorporated herein by reference for their disclosure of conventional DUV activated, acid hardening photoresist compositions and processes for their use.

An important property of a photoresist is image resolution. A developed photoresist image having lines not exceeding 1 micron in width and having vertical side-walls is highly desired to permit transfer of fine line images to an underlying substrate. Numerous factors are involved in the formation of high resolution images. One such factor is the strength of the developer used to develop an imaged photoresist coating. It is desirable to use a strong, high normality developer to rapidly penetrate the photoresist coating during the development process and to rapidly remove residue from the developed image. Consequently, developers are used at a strength that is only somewhat below that strength that would cause attack on portions of the exposed photoresist coating where development is undesired.

In practice, a development problem has been encountered when a strong developer is used to develop the acid hardening photoresists described above, especially when the resin binder used is a copolymer of an aromatic cyclic alcohol and a phenol. The problem involves microbridging between developed features. The term microbridging as used herein means a series of fine tendrils or strands of unremoved photoresist passing between adjacent photoresist features in a developed photoresist coating. Using a tetramethyl ammonium hydroxide (TMAH) developer for purposes of illustration, microbridging is encountered as the developer strength exceeds 0.20 N TMAH. However, for best results, TMAH developers are desirably used at a strength of about 0.26 N TMAH. Thus the problem of microbridging has limited the useable strength of the TMAH developer to about 0.15 N TMAH. This reduction in the strength of the TMAH developer has resulted in a sacrifice in image resolution, clean development and development time.

SUMMARY OF THE INVENTION

The invention described herein comprises a photoresist composition comprising an acid or base generator, a cross-linking agent activated by acid or base and alkali soluble resin having ring substituted hydroxyl groups where a portion of the hydroxyl groups are blocked with an inert blocking group. The term "inert" as used in connection with the blocking group is defined as chemically unreactive in the presence of acid or base generated during exposure and baking of the photoresist composition.

The cause of microbridging using strong developers is not understood. The elimination of microbridging by use of inert blocking groups on the resin binder is likewise not understood. Indeed, it is unexpected that microbridging can be essentially eliminated while high resolution images are obtained by use of inert blocking groups because the inert blocking groups reduce the number of available cross-linking sites for reaction during cure of the photoresist composition.

DESCRIPTION OF THE PREFERRED EMBODIMENTS

The polymer binders used in the acid-hardening photoresist of the invention are alkali soluble resins having ring substituted hydroxyl groups where a minor percentage of the hydroxyl groups are substituted with a group inert to acid or base generated during exposure and baking of the photoresist coating. Exemplary alkali soluble resins are novolac resins, poly(vinylphenol)s, polystyrenes, copolymers of vinyl phenols with various acrylate monomers such as methylmethacrylate, etc. Preferred resins for use in the photoresist of the invention are phenolic resins and preferred phenolic resins are the copolymers of cyclic alcohols and phenols such as those disclosed in U.S. Pat. No. 5,128,232 altered by blocking where a minor percentage of the hydroxyl groups are further blocked with the inert substituent.

Procedures for the preparation of conventional novolak and poly(vinylphenol) resins used as photoresists binders are well known in the art and disclosed in numerous publications including those discussed above. Novolak resins are the thermoplastic condensation products of a phenol and an aldehyde. Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or non-substituted hydroxybenzaldehydes with malonic acid. Preferred poly(vinylphenol) resins prepared from such vinylphenols have a molecular weight range of from about 2,000 to about 100,000 daltons As noted, preferred resins for purposes of this invention are polymers of phenols and nonaromatic cyclic alcohols analogous in structure to the novolak resins and poly(vinylphenol) resins. These polymers may be formed in several ways. For example, in the conventional preparation of a poly(vinylphenol) resin, a cyclic alcohol may be added to the reaction mixture as a comonomer during the polymerization reaction which is thereafter carried out in normal manner. The cyclic alcohol is preferably aliphatic, but may contain one or two double bonds. The cyclic alcohol is preferably one closest in structure to the phenol reactant. For example, if the resin is a polyvinyl phenol, the comonomer would be vinyl cyclohexanol.

A preferred method for formation of the polymer comprises partial hydrogenation of a preformed novolak resin or a preformed polyvinyl phenol resin. Hydrogenation may be carried out using art recognized hydrogenation procedures; for example, by passing a solution of the phenolic resin over a reducing catalyst such as a platinum or palladium coated carbon substrate, or preferably Raney nickel, at elevated temperature and pressure. The specific conditions are dependent upon the polymer to be hydrogenated. More particularly, the polymer is dissolved in a suitable solvent such as ethyl alcohol or acetic acid, and then the so formed solution is contacted with a finely divided Raney nickel catalyst and allowed to react at a temperature of from about 100° to 300° C. at a pressure of from about 50 to 300 atmospheres or more. The finely divided nickel catalyst may be a nickel-on-silica, nickel-on-alumina, or nickel-on-carbon catalyst depending upon the resin to be hydrogenated. Hydrogenation is believed to reduce the double bonds in some of the phenolic units resulting in a random copolymer of phenolic and cyclic alcohol units in percentages dependent upon the reaction conditions used.

Preferred polymer binders formed from poly(vinylphenol) or a novolak resin comprise units of a structure selected from the group consisting of:

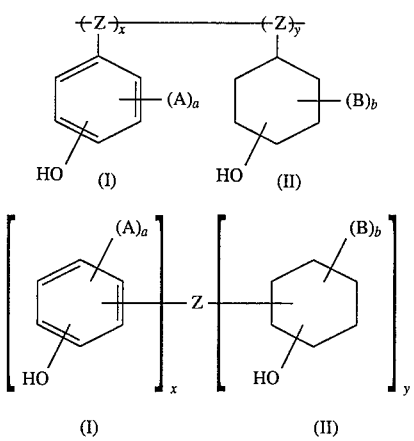

where each unit (I) represents a phenolic unit and unit (II) represents a cyclic alcohol unit; Z is an alkylene bridge having from 1 to 3 carbon atoms; A is a substituent on the aromatic ring replacing hydrogen such as lower alkyl having from 1 to 3 carbon atoms, halo such as chloro or bromo, alkoxy having from 1 to 3 carbon atoms, hydroxyl, nitro, amino, etc.; a is a number varying from 0 to 4; B is a substituent, such as hydrogen, lower alkyl having from 1 to 3 carbon atoms, halo such as chloro or bromo, alkoxy having from 1 to 3 carbon atoms, hydroxyl, nitro, amino, etc. provided that at least 3 of said B substituents are hydrogen; b is an integer varying between 6 and 10; x is the mole fraction of the units (I) in the polymer which varies between 0.50 and 0.99 and preferably varies between 0.70 and 0.90 and y is the mole fraction of units (II) in the polymer and varies between 0.01 and 0.50 and preferably between 0.10 and 0.30.

In accordance with the preferred embodiment of the invention, a portion of the hydroxyl groups substituted on the above depicted polymers are blocked with a suitable inert blocking group. The polymer having the blocking group would then conform to one of the following two structural formulas:

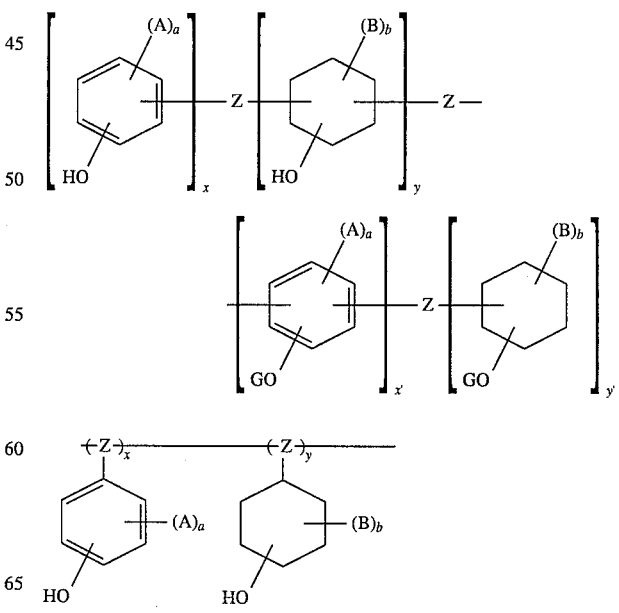

-continued

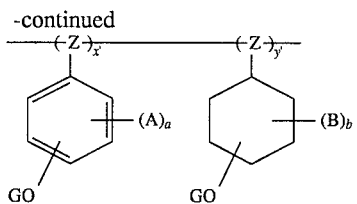

where A, a, B, b, Z and x and y are as defined above, x' and y' represent the mole fraction of the units having the inert blocking group and each varies between 0.01 and 0.20 where the total of x' and y' does not exceed 0.20 and preferably varies between 0.02 and 0.10, and —OG is an inert blocking group formed from a phenolic hydroxyl group. Any blocking group inert to generated acid or base at those elevated temperatures used to bake a photoresist and which does not interfere with the photolithographic reaction is suitable. Typical examples of suitable blocking groups include alkoxy groups such as methoxy, ethoxy, propoxy, n-butoxy, sec-butoxy, t-butoxy, etc.; alkyl esters represented by RCOO— wherein R is preferably an alkyl group having 1–4 carbon atoms such as methyl, ethyl, propyl, isopropyl and butyl, sec-butyl, t-butyl, etc.; a sulfonyl acid ester such as methanesulfonyl, ethanesulfonyl, propanesulfonic, benzenesulfonyl and toluene-sulfonyl esters, etc.

With respect to the above formulae, it should be understood that the invention is also applicable to novolak polymers and poly(vinylphenol)s that are not copolymers with cyclohexanol units. In this embodiment of the invention, y and y' in each of the above formulas III and IV would be 0.

The method used to prepare the preferred copolymers of the invention is not critical and does not constitute a part of this invention. A preferred method comprises an alkaline condensation reaction with a preformed copolymer and a compound that combines with the hydroxyl group to form the blocking group. For example, where the blocking group is a preferred sulfonic acid ester, a sulfonic acid halide is added to a solution of the polymer and a suitable base and the mixture stirred typically with heating. A variety of bases may be employed for the condensation reaction including hydroxides such as sodium hydroxide. The condensation reaction is typically carried out in an organic solvent. A variety of organic solvents are suitable as would be apparent to those skilled in the art. Ethers such as diethyl ether and tetrahydrofuran and ketones such as methyl ethyl ketone and acetone are preferred. Suitable conditions for the condensation reaction can be determined based upon the constituents used. For example, a mixture of sodium hydroxide, methanesulfonic acid chloride and a partially hydrogenated poly(vinylphenol) is stirred for about 15 to 20 hours at about 70° C. The percentage substitution of the polymer binder with the blocking group can be controlled by the amount of the blocking group precursor condensed with the polymer. The percent substitution on the hydroxyl sites of the polymer binder can be readily ascertained by proton and $^{13}C$ NMR.

It has been found that the blocking groups add predominantly to the more reactive phenolic hydroxyl groups rather than to the cyclic alcohol groups of the above-depicted polymer binder when a hydroxide base such as sodium hydroxide is employed as the condensation reaction catalyst. That is, for the most part, only the phenolic groups of the binder are bonded to the above defined blocking groups and the cyclic alcohol groups are substantially free of blocking groups. It is believed that blocking groups could add to both the phenolic and the cyclic alcohol groups of the binder by use of stronger bases such as alkyl lithium reagents.

The polymer binders described above are used in an acid or base hardening photoresist system comprising as additional ingredients, an acid or base generator and a crosslinking agent. The acid generator compound used in the combination may be chosen from a wide variety of compounds known to form acid or base upon exposure to activating radiation. One preferred class of radiation sensitive compositions of this invention are compositions that use the polymer of the phenol and cyclic alcohol with acid labile groups as a binder and an o-quinone diazide sulfonic acid ester as a radiation sensitive component. The sensitizers most often used in such compositions are naphthoquinone diazide sulfonic acids such as those disclosed by Kosar, *Light Sensitive Systems*, John Wiley & Sons, 1965, pp. 343 to 352, incorporated herein by reference. These sensitizers form an acid in response to radiation of different wavelengths ranging from visible to X-ray. Thus, the sensitizer chosen will depend in part, upon the wavelengths used for exposure. By selecting the appropriate sensitizer, the photoresists can be imaged by deep UV, E-beam, laser or any other activating radiation conventionally used for imaging photoresists. Preferred sensitizers include the 2, 1,4diazonaphthoquinone sulfonic acid esters and the 2,1,5-diazonaphthoquinone sulfonic acid esters.

Other useful acid generator include the family of nitrobenzyl esters, and the s-triazine derivatives. Suitable s-triazine acid generators are disclosed, for example, in U.S. Pat. No. 4,189,323, incorporated herein by reference.

Non-ionic photoacid generators are suitable including halogenated non-ionic, photoacid generating compounds such as, for example, 1,1-bis[p-chorophenyl]-2,2,2-trichloroethane (DDT); 1,1-bis [p-methoxyphenyl]-2,2,2-trichloroethane; 1,2,5,6,9,10-hexabromocyclododecane; 1,10-dibromodecane; 1,1 -bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-( 3,5,6-trichloro-2-pyridyl)phosphorothionate; 1,2,3,4,5,6-hexachlorocyclohexane; N(1,1-bis [p-chlorophenyl]-2,2,2-trichloroethyl)acetamide; tris[2,3-dibromopropyl]isocyanurate; 2,2-bis[p-chlorophenyl]-1, 1dichloroethylene; tris[trichloromethyl]s-triazine; and their isomers, analogs, homologs, and residual compounds. Suitable photoacid generators are also disclosed in European Patent Application Nos. 0164248 and 0232972, both referenced above.

Acid generators that are particularly preferred for deep U.V. exposure include 1,1-bis(p-chlorophenyl)-2,2,2-trichloroethane (DDT); 1,1-bis(p-methoxyphenol)-2,2,2,-trichloroethane; 1,1-bis(chlorophenyl)-2,2,2 trichloroethanol; tris( 1,2,3-methanesulfonyl)benzene; and tris(trichloromethyl)triazine.

Onium salts are also suitable acid generators. Onium salts with weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenonium salts. Examples of suitable preferred onium salts can be found in U.S. Pat. Nos. 4,442, 197; 4,603,101; and 4,624,912, all incorporated herein by reference.

Another group of suitable acid generators is the family of sulfonated esters including sulfonyloxy ketones. Suitable sulfonated esters have been reporting in J. of Photopolymer Science and Technology, vol. 4, No. 3,337–340 (1991), incorporated herein by reference, including benzoin tosylate, t-butylphenyl alpha-(p-toluenesulfonyloxy)-acetate, and t-butyl alpha-(p-toluenesulfonyloxy)-acetate.

The cross-linking agents used in the photoresist on the invention are those activated by the generation of acid or base upon exposure to activating radiation. Typical cross-linking agents include a polymer that crosslinks in the presence of an acid catalyst and heat. Any of a variety of aminoplast or phenoplasts in combination with compounds or low molecular weight polymers containing a plurality of hydroxyl, carboxyl, amide or imide groups may be used. Suitable aminoplasts include urea-formaldehyde; melamine-formaldehyde; benzoguanamine-formaldehyde; glycoluril-formaldehyde resins and combinations thereof. The combination may also comprise a phenoplast and a latent formaldehyde generating compound. These latent formaldehyde generating compounds include s-trioxazine, N(2-hydroxyethyl) oxazolidine and oxazolidinylethyl methacrylate. Additional exemplification of suitable materials are disclosed in the above referenced European Patent Application Nos. 0164248 and 0232972 and U.S. Pat. No. 5,128,232.

Preferred cross-linking agents are the amine-based cross-linkers such as the melamine-formaldehyde resins inclusive of those available from American Cyanamid under the trade name Cymel.

The compositions of the invention are generally prepared following prior art procedures for the preparation of photoresist compositions with the exception that the polymer binder with the blocking group as described herein is substituted at least in part for the conventional resins used in the formulation of such photoresists. The compositions of the invention are formulated as a coating composition by dissolving the components of the composition in a suitable solvent such as, for example, a glycol ether such as 2-methoxyethyl ether (diglyme), ethylene glycol monomethyl ether, ethylene glycol monomethyl ether, propylene glycol monomethyl ether; a Cellosolve ester such as methyl Cellosolve acetate; an aromatic hydrocarbon such as toluene or xylene; or a ketone such as methyl ethyl ketone. Typically, the solids content of the composition varies between about 5 and 35 percent by weight of the total weight of the radiation sensitive composition.

The compositions of the invention are used in accordance with generally known procedures though exposure and development conditions may vary as a consequence of improved photospeed and altered solubility in developer. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The composition is applied to a substrate conventionally used in processes involving coating with photoresists. For example, the composition may be applied over silicon or silicon dioxide wafers for the production of microprocessors and other integrated circuit components. Aluminum-aluminum oxide and silicon nitride wafers can also be coated with the photocurable compositions of the invention as a planarizing layer or for formation of multiple layers in accordance with art recognized procedures.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 10 to 300 $mJ/cm^2$, dependent upon the exposure tool and the components of the photoresist composition.

A wide range of activating radiation can be suitably employed to expose the photoacid or photo-base generating compositions of the invention, including radiation of wavelengths anywhere in the range of from about 240 to 700 nm. As noted above, the compositions of the invention are especially suitable for deep UV exposure. The spectral response of the compositions of invention can be expanded by the addition of suitable radiation sensitize compounds to the composition as would be apparent to those skilled in the art.

Following exposure, the film layer of the composition is preferably baked at temperatures ranging from about 70° C. to about 140° C. Thereafter, the film is developed. The exposed resist film is rendered negative working by employing a polar developer, preferably an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine or, methyldiethyl amine; alcohol amines such as diethanol amine or triethanol amine; cyclic amines such as pyrrole, pyridine, etc. The developer strength can be higher using the modified resins in accordance with this invention compared to the resins used in the prior art in such compositions. Typically, developer strength can exceed 0.2 N TMAH and typically can be as high as 0.3 N TMAH with 0.26 NTMAH being preferred.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, for example, the manufacture of silicon dioxide wafers, suitable etchants include a plasma gas etch and a hydrofluoric acid etching solution. The compositions of the invention are highly resistant to such etchants thereby enabling manufacture of highly resolved features, including lines with submicron widths. After such processing, resist may be removed from the processed substrate using known stripping procedures.

The following examples are illustrative of the invention.

GENERAL COMMENTS

In the examples, the hydrogenated poly(vinylphenol) resin used was PHM-C grade obtained from Maruzen Oil of Tokyo, Japan. The degree of hydrogenation of these poly(p-vinylphenols) is expressed as a percentage of aromatic double bonds converted to single bonds, or equivalently as a percentage of hydroxyphenyl groups converted to hydroxycyclohexyl groups. All temperatures used throughout this disclosure are in degrees Celsius

EXAMPLE 1 (Comparative Example)

This example demonstrates resolution obtained when a negative tone DUV resist is developed in a high normality developer utilizing a conventional resin as binder. The materials used to prepare the photoresist are set forth below and expressed in parts by weight:

| | |
|---|---|
| Propylene glycol monomethyl ether acetate | 58.09 |
| Methoxybenzene | 19.36 |
| Poly(p-vinyl)phenol (10% hydrogenated) | 20.00 |
| Hexamethoxymethylmelamine[a] | 1.50 |
| Tris(2,3-dibromopropyl)isocyanurate | 1.00 |
| Polymethylsiloxane[b] | 0.045 |

[a]Cymel 303 (American Cyanamid Co.)
[b]Silwet L-7604 (Union Carbide Co.)

The photoresist was spin-coated onto bare silicon wafers (vapor-primed with HMDS) for 30 seconds, then softbaked at 125° C. for 60 seconds on a vacuum hotplate yielding a film of 1.02 micron thickness as determined by a Nanospec 215 reflectance spectrophotometer. An array of line space pairs with varying dimensions down to 0.25 microns was exposed over a range of exposure energies using a GCA 0.35 NA excimer laser stepper. The wafers were then post-exposure baked on a vacuum hotplate at 125° for 60 seconds. Exposed wafers were then developed using Shipley® MF-703 (0.26 tetramethylammonium hydroxide with an added surfactant) on a GCA Micro-Trak using a double puddle program for 5 times the clearing time of an unexposed area of photoresist and being 30 seconds total. Patterned wafers were diced and examined by scanning electron microscopy (SEM) to determine the minimum size line-space pair that was resolved and photoresist profile characteristics. SEM analysis showed that 0.46 µm line space pairs were resolved with clean profiles but at 0.44 µm line space pairs, microbridging occurred.

EXAMPLE 2

This example demonstrates the ability to eliminate microbridging using the polymers of this invention.

The materials used to prepare the photoresists are set forth below, in parts by weight.

| | |
|---|---|
| Propylene glycol monomethyl ether acetate | 57.34 |
| Methoxybenzene | 19.11 |
| Poly(p-vinyl)phenol (10% hydrogenated) blocked at 10% level with n-Butyl Groups | 20.89 |
| Hexamethoxymethylmelamine[a] | 1.57 |
| Tris(2,3-dibromopropyl)isocyanurate | 1.044 |
| Polymethylsiloxane[b] | 0.047 |

[a]Cymel 303 (American Cyanamid Co.)
[b]Silwet L-7604 (Union Carbide Co.)

The photoresist was spin-coated onto bare silicon wafers (primed with HMDS), then softbaked at 125° C. for 60 seconds on a vacuum hotplate yielding a film of 1.02 micron thickness as determined by a Nanospec 2 15 reflectance spectrophotometer. An array of line space pairs with varying dimensions down to 0.25 microns was exposed over a range of exposure energies using a GCA 0.35 NA excimer laser stepper. The waters were then post-exposure baked on a vacuum hotplate at 125° for 60 seconds. Exposed wafers were then developed using 0.26 tetramethylammonium hydroxide with the same added surfactant as in Example 1 on a GCA microtrak developer line for 5 times the clearing time for an unexposed area of photoresist and being 75 seconds total. Patterned waters were diced and examined by scanning electron microscopy to determine the minimum size line-space pair that was resolved and profile characteristics. SEM examination revealed resolution of 0.36 µm at an exposure energy of 151 mJ/cm$^2$ with no "microbridging" of features as was observed in Example 1.

EXAMPLE 3

This example demonstrates that by using a polymer of this invention, both high resolution and extremely fast photo-speed may be obtained in higher normality developers. The materials used to prepare the photoresist for this example are set forth below, in parts by weight:

| | |
|---|---|
| Ethyl Lactate (solvent) | 83.968 |
| Poly(p-vinyl)phenol (10% Hydrogenated) Blocked at 5% level by Mesyl Groups | 14.612 |
| Modified glycoluril resin[a] | 1.096 |
| Tri-aryl sulfonium triflate (photoacid generator) | 0.292 |
| Polymethylsiloxane[b] | 0.032 |

[a]Powderlink 1174 (American Cyanamid Co.)
[b]Silwet L-7604 (Union Carbide Co.)

The photoresist was spin-coated onto bare silicon wafers (vapor-primed with HMDS) for 30 seconds, then softbaked at 90° C. for 60 seconds on a vacuum hotplate yielding a film of 0.54 micron thickness ad determined by Prometrix film thickness monitor. An array of line space pairs with varying dimensions down to 0.25 microns was exposed over a range of exposure energies using a GCA 0.35 NA excimer laser stepper. The wafers were then post-exposure baked on a vacuum hotplate at 105° for 60 seconds. Exposed wafers were then developed using either 0.21 Normal Tetramethylammonium hydroxide with an added surfactant (Shipley® MF702 Developer) or 0.26 Tertramethylammonium hydroxide with an added surfactant (Shipley® MF-703) on a GCA Micro-Trak using a double puddle program for 5 times the clearing time for an unexposed area of photoresist and being 60 seconds total for MF702 developer and 35 seconds total for MF703 developer. Patterned wafers were diced and examined by scanning electron microscopy (SEM) to determine the minimum size line-space pair that was resolved. SEM examination revealed 0.28 µm resolution of line space pairs in both developers. No microbridging of features was observed. The energy dose required to size the features was 13 mJ/cm$^2$ in 0.21 Normal developer, and 12 mJ/cm$^2$ in 0.26 Normal developer.

We claim:

1. A negative acting photoresist composition comprising the combination of a compound that generates an acid or base upon exposure to activating radiation and an acid or base activated crosslinking agent, and an alkali soluble resin binder, said combination of acid or base generator and crosslinking agent being present in an amount sufficient to crosslink said photoresist composition in areas exposed to activating radiation, and said alkali soluble resin having hydroxyl groups where a minor portion of the hydroxyl groups are reacted with a reactant to form a blocking group inert to acid or base.

2. The photoresist composition of claim 1 where the alkali soluble resin is a phenolic resin.

3. The photoresist composition of claim 2 where the resin binder is a copolymer of a phenol and a cyclohexanol.

4. The photoresist composition of claim 3 where the resin binder is a hydrogenated polyvinyl phenol resin.

5. The photoresist composition of claim 3 where the resin binder is a hydrogenated resin.

6. The photoresist composition of claim 5 where less than 50 percent of the phenolic groups have been hydrogenated.

7. The photoresist of claim 6 where the percentage of hydrogenated groups does not exceed 30 percent.

8. The photoresist composition of claim 7 where the percentage varies between 1 and 30 mole percent.

9. The photoresist of claim 5 where the percentage of hydrogenated groups does not exceed 30 percent and the portion of the hydroxyl groups reacted to form inert blocking groups ranges between 1 and 10 mole percent of the total of the hydroxyl groups.

10. The photoresist composition of claim 2 where the hydroxyl groups are phenolic hydroxyl groups and the portion of the hydroxyl groups reacted to form inert blocking groups ranges between 1 and 20 mole percent of the total of the phenolic hydroxyl groups.

11. The photoresist composition of claim 10 where the percentage varies between 2 and 10 percent.

12. A negative acting photoresist composition comprising the combination of a compound that generates an acid or base upon exposure to activating radiation and an acid or base activated crosslinking agent, and an alkali soluble resin binder conforming to a formula selected from the group consisting of:

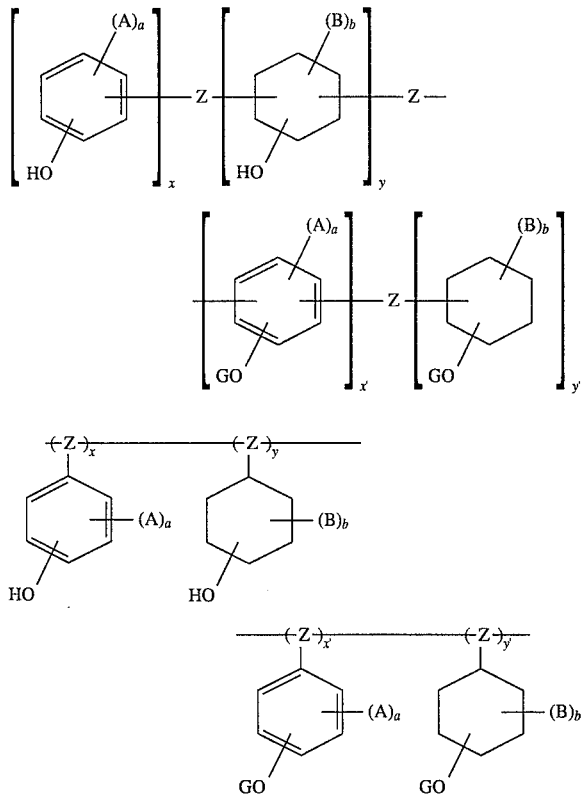

where Z is an alkylene bridge having from 1 to 3 carbon atoms; each A is a substituent on the aromatic ring replacing a hydrogen atom selected from the group consisting of lower alkyl having from 1 to 3 carbon atoms, haloalkoxy having from 1 to 3 carbon atoms, hydroxyl, nitro and amino; a is a whole integer varying from 0 to 4; each B is a substituent on a cyclic alcohol ring selected from the group consisting of hydrogen, lower alkyl having from 1 to 3 carbon atoms, halo, alkoxy having from 1 to 3 carbon atoms, hydroxyl, nitro and amino; b is a whole integer varying between 0 and 6; x is the mole fraction of phenolic units and varies between 0.50 and 0.99; y is the mole fraction of cyclohexanol units and varies between 0.01 and 0.50, x' is the mole fraction of phenolic units having the inert blocking group and y' is the mole fraction of cyclohexanol units having the inert blocking group and each varies between 0.01 and 0.20; and —OG is a blocking group inert to reaction with acid or base, said combination of acid or base generator and crosslinking agent being present in an amount sufficient to crosslink said photoresist composition in areas exposed to activating radiation.

13. The photoresist composition of claim 12 where y varies between 0.02 and 0.10.

14. The photoresist composition of claim 12 where the resin binder is a hydrogenated novolak resin or a hydrogenated poly(vinylphenol) resin where the resin has a portion of its phenolic hydroxyl groups reacted to form the inert blocking group.

15. The photoresist composition of claim 14 where the resin binder is a hydrogenated poly(vinylphenol) resin.

16. The photoresist composition of claim 14 where the resin binder is a hydrogenated novolak resin.

17. The photoresist composition of claim 12 where x varies between 0.99 and 0.70.

18. The photoresist composition of claim 12 where the generator compound is an acid generator.

19. The photoresist composition of claim 12 where the crosslinking agent is a melamine formaldehyde resin.

* * * * *